United States Patent [19]

Cvijanovich

[11] Patent Number: 4,931,991
[45] Date of Patent: Jun. 5, 1990

[54] MACHINE READABLE MEMORY CARD WITH CAPACITIVE INTERCONNECT

[75] Inventor: George B. Cvijanovich, Winston-Salem, N.C.

[73] Assignee: AMP Incorporated, Harrisburg, Pa.

[21] Appl. No.: 289,089

[22] Filed: Dec. 22, 1988

[51] Int. Cl.⁵ ................. G06K 19/06; G06K 7/06; G11C 17/00
[52] U.S. Cl. ................................. 365/52; 365/53; 340/870.37; 235/451; 235/492; 235/441
[58] Field of Search ............ 365/52, 53, 60, 59, 365/61, 149, 145; 235/492, 441, 451; 340/825.31, 825.34, 870.37; 70/278

[56] References Cited

U.S. PATENT DOCUMENTS

| | | | |
|---|---|---|---|
| 4,602,351 | 7/1986 | Shimamura et al. | 365/52 |
| 4,621,190 | 11/1986 | Saito et al. | 235/492 |
| 4,634,847 | 1/1987 | Jürgen | 235/451 X |
| 4,675,516 | 6/1987 | Guion | 235/492 |
| 4,752,680 | 6/1988 | Larsson | 235/492 X |
| 4,763,340 | 8/1988 | Yoneda et al. | 340/870.37 |
| 4,780,604 | 10/1988 | Hasegawa et al. | 365/53 |
| 4,795,895 | 1/1989 | Hara et al. | 235/492 |
| 4,835,373 | 4/1989 | Adams et al. | 235/451 |

FOREIGN PATENT DOCUMENTS

| | | | |
|---|---|---|---|
| 59-36387 | 1/1984 | Japan | 365/52 |
| 60-234286 | 11/1985 | Japan | 365/52 |

Primary Examiner—James W. Moffitt
Assistant Examiner—Alfonso Garcia
Attorney, Agent, or Firm—Robert W. Pitts

[57] ABSTRACT

An interconnection system for transferring either electrical energy in the form of power and data signals or both is disclosed. Capacitive coupling devices are shown connected to a memory device such as an erasable programmable read only memory chip, in a form suitable for use in a smart data entry card. The capacitive coupling devices employ a dielectric medium having a relatively high dielectric constant due to the orientation of the crystals of the dielectric medium. Barium Titinate having a dielectric constant of 18,000 in the direction of the crystal axis is used. Only small bearing pressures sufficient to wipe contaminants from the exposed contact pads are required.

5 Claims, 4 Drawing Sheets

MACHINE READABLE MEMORY CARD WITH CAPACITIVE INTERCONNECT

FIELD OF THE INVENTION

The present invention relates to an electrical connector and method for interconnecting circuit paths to transmit digital and other signals through a low pressure bearing engagement between two circuits, such as a circuit in memory card and another circuit in a reader, in which signal information is transmitted by a fundamental change in capacitive coupling technique.

BACKGROUND OF THE INVENTION

Interconnections for electric assemblies typically include low reactance characteristics based on metal-to-metal contact; permanent interconnections being on the order of micro-ohms and disconnects being on the order of milliohms. Desirably, such interconnections have characteristics of stability in the presence of heat and time, of reproduceability from one interconnection to the next within a given process. The so-called permanent connections are achieved through processes such as soldering, welding, brazing, crimping, and wire bonding. Interconnections achieved through disconnect structures utilize relatively high pressure, spring brased interfaces frequently involving surface finishes employing noble metal plating thereon.

Interconnections of the disconnect type typically require normal forces on the order of 80 to 150 grams and frequently employ wiping action to eliminate surface oxides and/or dielectric debris. Forces of this magnitude, if applied in the form of wiping action, degrade the contact interface and limit the life or number of interconnects that can be made. The alternative is to utilize relatively thick coatings of precious metal, which practice is costly.

Interconnection of intelligence channels for intelligence transfer through digital or other signals can be accomplished magnetically as through the scanning of a magnetic medium such as a tape by magnetic head pickup. Optical techniques are also available wherein intelligence is transmitted as between phototransmitters and photoreceptors. Finally, as part of the background, a variety of techniques are employed utilizing radio frequency transmission, the so-called RF techniques widely employed through frequency modulation, audio amplitude modulation, and pulse code width modulation.

All of the foregoing have their advantages and applications, but all have certain shortcomings. Interconnections which require a physical metal-to-metal engagement under relatively high spring pressures and/or utilizing noble metals have quite limited lives in terms of the number of cycles of engagement possible and as well are vulnerable to the effects of moisture, industrial gases, and/or corrosive fluids and gases. Magnetic and optical techniques likewise are subject to environmental constraints. The optical techniques require a medium through which light can pass or at least a medium transparent to particular frequencies. The magnetic techniques require close proximity and are not readily sealable. RF devices are notably subject to interference such as static and field-caused noise.

SUMMARY OF THE INVENTION

The present invention utilizes a memory card containing capacitive input devices employing a material having a relatively large dielectric constant. In the preferred illustrative embodiment, the devices are formed of laminated structures having metal electrodes on each side of a barium titanate material, the electrodes being interconnected to signal channels capable of developing analog or digital signals in the range from 0 to 6 volts, both unipolar or bipolar, if desired. The relatively high dielectric constant of the barium titanate dielectric medium permits a reliable low force interconnection to be made because only a single point contact with a card reader is necessary for each output pad.

IN THE DRAWINGS

DETAILED DESCRIPTION OF THE INVENTION

Figure 1:
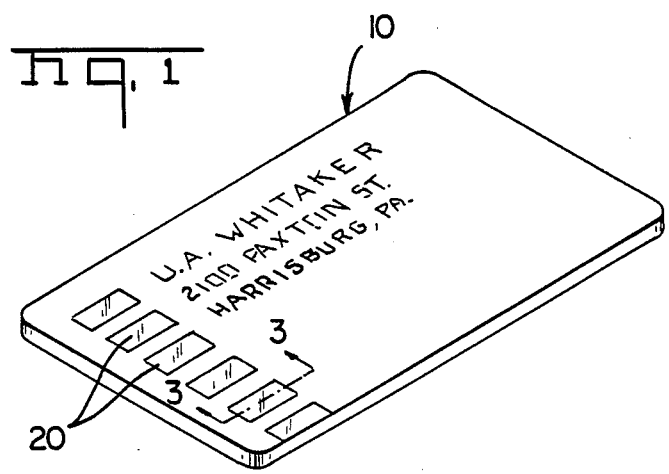
FIG. 1 is a perspective of an electronic circuit package in the form of a credit or data card having a plurality of invention devices along one edge thereof and embedded within such card.

Referring now to FIG. 1, the element numbered 10 represents a plastic card of the type frequently referred to as a credit card or a data card or a "smart card," the latter term being employed particularly with respect to cards which contain integrated circuits therewithin. The card may contain on its face symbols, including names and numbers and sources of the card, or in certain instances, may be preferably be blank. FIG. 1 shows a series of interconnection pads or zones 20, six of which are in card 10 for illustrative purposes. Cards of this type are fairly well standardized to a dimension on the order of 3.365 inches by 2.120 inches and on the order of 0.030 inches in thickness with some substantial variation in thickness dependent upon the use and type of embossment and/or inclusion of integrated circuits within the usual plastic laminations of the card. Such cards may have additional intelligence in the form of magnetic stripes, bar codes for optical reading, and as mentioned, embossments to effectively render imprinting upon sales slips, records, and the like. In general, the amount of intelligence as measured in bits effected through embossments, magnetic stripes, and optical markings is quite limited.

This had led to the development of the so-called "smart card" which contains integrated circuits including various logic circuits and memory devices, including ROM, EROM, and EPROM, the latter standing for Erasable Programmable Read Only Memory. Through the use of such circuits, the various memories may be accessed, read into, read out of, erased, changed, and otherwise manipulated, depending upon the circuits chosen. In this way, individual files, including medical histories, personal data, historical data, financial records, and considerable information may be stored to become portable and to travel with an individual for a wide variety of uses. In accordance with prior art techniques, a number of ways have been employed to effect interconnections to the logic and memory integrated circuits within the card, including gold plated contact fingers disposed on the edge of a card which are read by card reader fingers contained in a card reader and to which the card is inserted. The use of precious metals to enhance the life of the fingers on a card is almost necessitated by the presence of oxide-causing moisture and various chemicals resulting from the handling of the card. Wear and tear upon the card fingers can cause false readings as well as the presence of dielectric debris.

Figure 2:
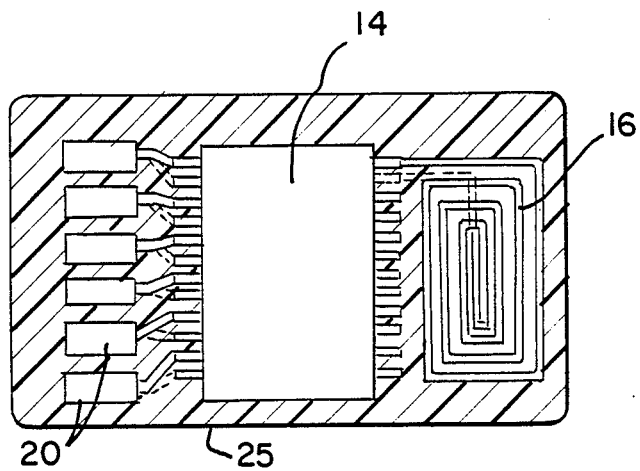
FIG. 2 is a sectional view showing the interior of the card showing capacitative input elements interconnected to an integrated circuit, in turn interconnected to an inductive source of power for such circuit.
Figure 3:
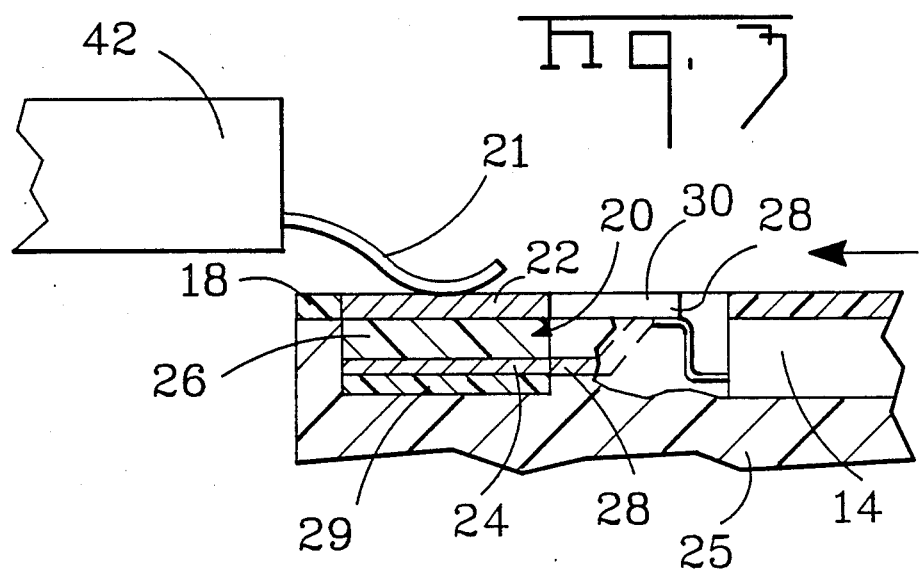
FIG. 3 is a sectional view of the card showing a contact finger engaging a contact pad in the card to permit the input and output of data to and from the card reader.

FIG. 2 shows the logic and memory integrated circuits as element 14. Power for such circuits is provided through an inductive coupling with a coil 16 proximate the upper surface of the card just beneath an outer membrane 18 which covers the power coupling 16 and the interconnection paths leading to contact pads 20. The power windings of 16 may typically be formed of etched copper in a suitable pattern to be inductively coupled by coil mounted in a card reader head generating an alternating current field which induces a voltage in the coil of 16 which in turn effects current flow through leads connected to Referring now to FIGS. 2 and 3, the interconnection paths or leads 28, 30 may be seen to reside at the upper surface of card 10 just beneath the membrane 18. The upper contact surfaces or electrodes of contact pads 20, however, are exposed on the upper surface of the cards. The contact pads 20 each comprise upper and lower electrodes 22 and 24 sandwiched and bonded to a dielectric medium 26 in lamina fashion The electrodes 22 and 24 are connected to the integrated circuit 14 through a pair of leads shown as 28 and 30 in FIGS. 2 and 3.

Figure 8:
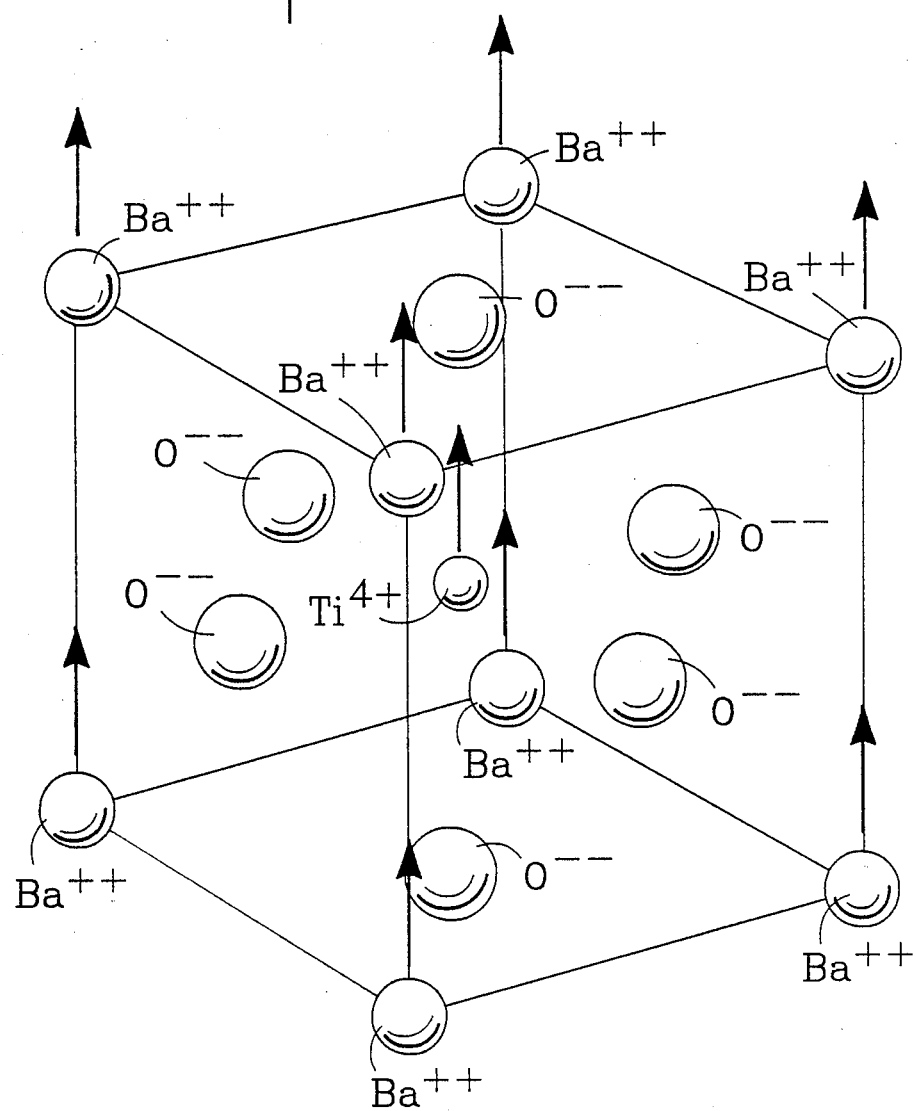
FIG. 8 is a representation of the crystal structure of barium titanate.

The capacitive contact pads 20 can be formed by using devices purchased from Piezo Electric Products, Metuchen, N.J. These commercially available devices are comprised of a lamination of thin copper or nickel foils having therebetween a dielectric material such as barium titanate ($Ba_2TiO_3$) of the oriented variety. This barium titanate has a dielectric constant on the order of 10,000 in the direction of the crystal axis. FIG. 8 shows a barium titanate crystal, the structure of which is well known as evidenced by Huheey, J, *Inorganic Chemistry*, Harper & Row 1983. The direction of the dipole movement is shown by the arrows in FIG. 8. It is along this direction or axis that the dielectric constant of barium titanate is on the order 10,000. The dielectric constant of barium titanate in the direction perpendicular to the crystal axis is less than ten times that of air. The capacitors employed in this invention are formed with the crystal axis of the barium titanate dielectric medium perpendicular to the electrodes 22 and 26 so that the effective dielectric constant is on the order of 10,000.

It would be practical to employ devices 20 energized by voltages ranging between 1 and 6 volts in a frequency from roughly 20 hertz to 10 megahertz. In practice, the devices 20 may be bonded to a carrier shown as 29 affixed in a premoulded package in the body of the plastic card 25. Wiping forces were on the order of 10 grams.

Figure 4:
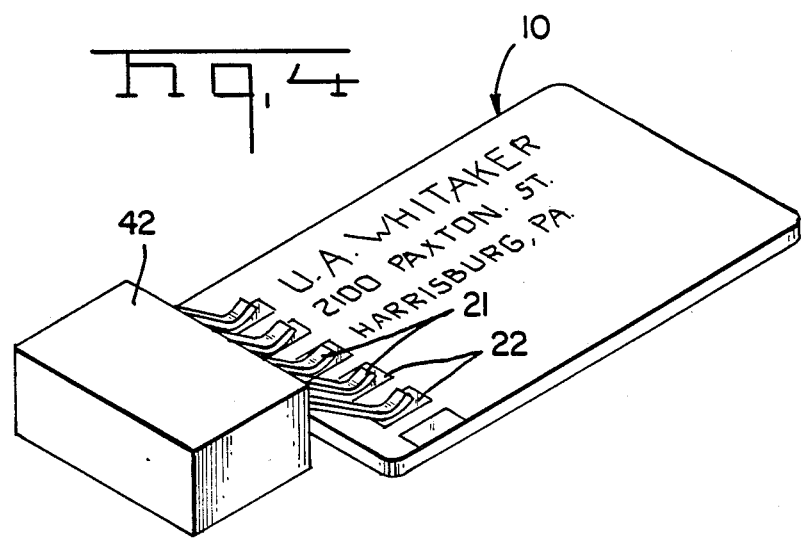
FIG. 4 is a schematic view illustrating the interconnection concept of the invention in conjunction with drive and driven circuits.
Figure 5:
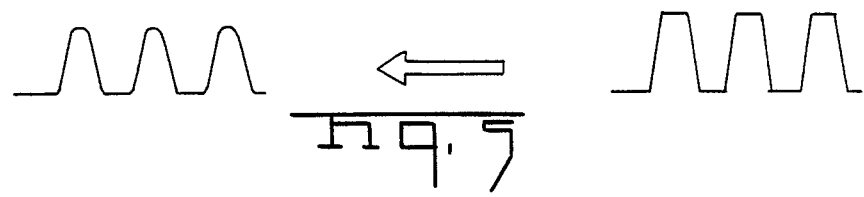
FIG. 5 depicts typical intelligence wave forms transmitted in the manner shown in FIG. 4.

FIG. 4 shows that contact can be established with the upper electrode 22 by the reader contact finger 21. Unlike conventional ohmic contacts, this contact need only comprise a single point contact, since the primary interconnection mechanism is capacitive. With conventional ohmic contact, a number of points or asperities must be in contact so that sufficient cross-sectional area is provided to carry a detectable signal current. With this invention, only a single point contact is necessary since only the voltage on the upper electrode 22 will be sensed by the finger when the card is read or altered when information is read into the memory of the card. Large signal transport currents are not required. Therefore the high forces otherwise necessary for data signal transmission are not needed. Significantly these same high forces employed with conventional card readers would be felt by both the contact pads 20 on the card and the reader finger 21. Some wiping action would be necessary between the finger 21 and the upper electrode of the contact pads to remove contaminants, but sufficient wiping action can be provided with a contact of much less force. The relatively small changes in voltage on the electrodes can be capacitively sensed because of the relatively high dielectric constant of the dielectric medium 26. FIG. 4 shows that a similar output waveform would be generated using this input/output mechanism.

These capacitive input devices need not employ precious metal plating, although precious metal platings would increase the useful life of both the cards and the contact elements needed for a card reader. Typical smart cards, and especially card readers, must experience many connections and disconnections over their lifetime. Therefore, the contact force reductions which can be achieved using these capacitive input devices, with or without precious metal platings, will greatly prolong the useful life of such devices.

The instant invention differs from conventional capacitive coupling in which an input capacitance on an electrode on an input device is sensed by another electrode in the output device. In the instant invention a point contact is made between a first contact member such as a card reader finger 21 and the outer electrode 22 of the capacitive input pad 20. By virtue of this point contact, there is no potential difference between contact finger 21 and electrode 22. Little transport current occurs between contact finger 21 and electrode 22. Therefore, only a small contact area, essentially point contact need be established: However, due to the relatively high dielectric constant of the material between electrodes, a small change in voltage on one electrode will produce a relatively large detectable displacement current.

Figure 6:
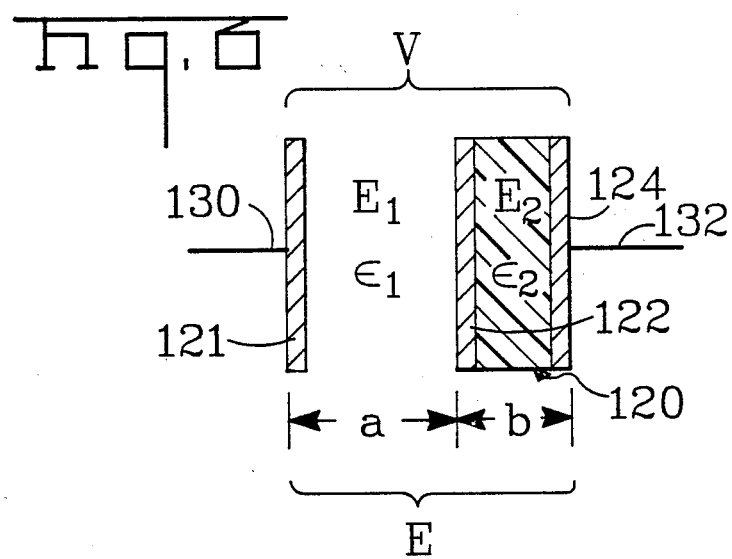
FIG. 6 is an illustration of the relevant electrical fields.

The only force necessary for the inventive interconnection is the force necessary to wipe away contaminants. FIG. 6 illustrates the condition if point contact is not established for example by the failure to remove contaminates or the presence of air between exterior conductive surfaces. As shown in FIG. 6, the input voltage on element 121 (corresponding to card reader finger 21) is not sensed by a capacitive input pad 120 (corresponding to page 20) even though a relatively high dielectric material 126 is employed. FIG. 6 shows that the first circuit 130 is separated from the second circuit 132 by two dielectrics having dielectric constants $\epsilon_1$ and $\epsilon_2$ where $\epsilon_2 >> \epsilon_1$. The electric field strength across each dielectric is then given by:

$$E_1 = \frac{q}{\epsilon_0 \epsilon_1} A; \quad E_2 = \frac{q}{\epsilon_0 \epsilon_2} A$$

The potential difference $\gamma$ is given by:

$$\gamma = \int E \cdot dl = \int \frac{q}{\epsilon_0 A} \left( \frac{a}{\epsilon_1} + \frac{b}{\epsilon_2} \right)$$

Since $\epsilon_2 >> \epsilon_1$ $$\gamma = \frac{q}{\epsilon_0 A} \cdot \frac{a}{\epsilon_1}$$

In other words, virtually the entire voltage drop would occur across the dielectric having the lowest dielectric constant. Therefore, such a change in voltage at 130 would not be sensed at 132 if air or some other low dielectric constant material such as dirt, grease or some other contaminant is present on the surface of the outer electrode 122 as shown in FIG. 6. The capacitance would be given by:

$$C = \frac{q}{\gamma} = \frac{\epsilon_0 A}{\frac{a}{\epsilon_1} + \frac{b}{\epsilon_2}}$$

and for $\epsilon_2 >> \epsilon_1$ and $\epsilon_2 >> b$ $$C = \frac{\epsilon_0 A}{a} \epsilon_1$$

In other words, the capacitance is not a function of any parameters representative of the input capacitive element 120, especially the large dielectric constant of dielectric material 126.

The low dielectric material could be eliminated by establishing only a point contact between element 130 and the outer electrode 122. The impedance between 130 and 132 would then be a function of the capacitance between electrodes 122 and 124 which is a function of the dielectric constant $\epsilon_2$.

$$X_c = \frac{1}{\omega C}$$

$$C = \epsilon_0 \epsilon_2 \frac{A}{d}$$

For barium titanate $\epsilon_2 \approx 10^4$. To calculate the impedance for an input device of the type represented by this invention:

$$\epsilon_0 = 8.854 \times 10^{-12}$$

$$\epsilon_2 \beta 10^4$$

For a practical capacitive input device:

$$A \sim 10^{-3} \times 10^{-1} = 10^{-4} \text{ in}^2$$
$$d \sim 10 \times 10^{-6} \text{ in} = 10^{-5} \text{ in}.$$

$$\frac{A}{d} = \frac{10^{-4}}{10^{-5}} = 10$$

$$\epsilon_0 \epsilon_2 \frac{A}{d} = 8.854 \times 10^{-7} \text{ farad}$$

$$C = 8.854 \times 10^{-1} \mu F \sim .9 \mu F$$

at $10^6$ Hz; $\omega = 2\pi \times 10^{-6}$ $$X_c = \frac{1}{\omega C} = \frac{1}{(2\pi \cdot 10^6)(.9 \times 10^{-7})}$$

$$X_c = 1.6 \text{ ohms at } 10^6 \text{ Hz}$$

A small voltage change on one side of the high dielectric material will cause a large current to flow if there is point contact with one electrode.

$$i = C \frac{du}{dt}$$

Figure 7:
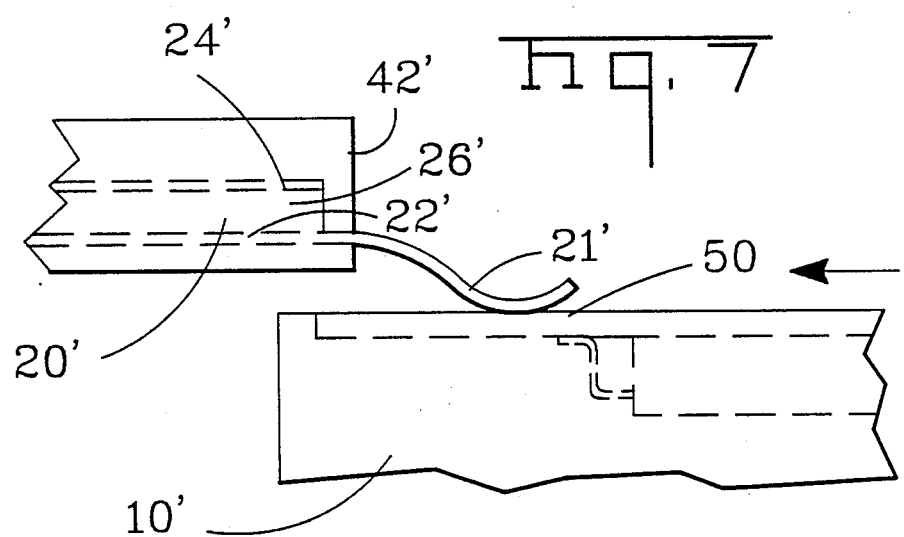
FIG. 7 shows an alternate embodiment in which the capacitive input device is in the card reader.

The preferred embodiment of this invention shows a smart card in which capacitive input devices 20 are incorporated into the card. It should be understood, however, that these capacitive input devices could be incorporated into the card reader in the manner shown in FIG. 7. In this embodiment only traces 50 comprising a single electrode would be required. Card reader finger 21' would comprise an extension of the outer electrode 22' on the capacitive input element 20' on the card reader 42'.

I claim:

1. In a system for transferring intelligence, a first circuit including memory means for storing said intelligence and for effecting a readout of said intelligence, said first circuit including a plurality of contact pads interconnected to the memory means, each contact pad comprising first and second electrodes separated by an internal dielectric medium having a dielectric constant orders of magnitude greater than the dielectric constant of air, the first electrode being exposed so that the first circuit is adapted to be connected to a second circuit by electrically conductive contact means for establishing an ohmic point contact between the first and second circuit by wiping action with an exposed contact surface on one of the first and second circuits; whereby intelligence can be capacitively transferred between the first and the second circuits, relatively small changes in voltage being detectable due to the relatively large dielectric constant of the internal dielectric medium, so that the interconnection remains substantially unaffected by dielectric materials on the exterior of the exposed contact surface.

2. The system of claim 1 wherein the internal dielectric medium has a dielectric constant on the order of $10^4$ times the dielectric constant of air.

3. The system of claim 2 wherein the internal dielectric medium comprises a piezoelectric material.

4. The system of claim 2 wherein the internal dielectric medium comprises barium titanate.

5. The system of claim 4 wherein the internal dielectric medium comprises oriented barium titanate in which the axis of barium titanate crystals is oriented orthogonally relative to the first and second electrodes.

* * * * *